United States Patent
Liepold et al.

(10) Patent No.: US 12,003,217 B2
(45) Date of Patent: Jun. 4, 2024

(54) OSCILLATOR FREQUENCY COMPENSATION WITH A FIXED CAPACITOR

(71) Applicant: Cypress Semiconductor Corporation, San Jose, CA (US)

(72) Inventors: Carl Liepold, Sunnyvale, CA (US); Austin Chan, Mercer Island, WA (US)

(73) Assignee: Cypress Semiconductor Corporation, San Jose, CA (US)

( * ) Notice: Subject to any disclaimer, the term of this patent is extended or adjusted under 35 U.S.C. 154(b) by 64 days.

(21) Appl. No.: 17/965,702

(22) Filed: Oct. 13, 2022

(65) Prior Publication Data

US 2024/0128927 A1    Apr. 18, 2024

(51) Int. Cl.
*H03B 5/04*      (2006.01)
*H03B 5/06*      (2006.01)
*H03B 5/12*      (2006.01)

(52) U.S. Cl.
CPC .............. *H03B 5/04* (2013.01); *H03B 5/06* (2013.01); *H03B 5/1271* (2013.01)

(58) Field of Classification Search
CPC ........... H03B 5/04; H03B 5/06; H03B 5/1271
See application file for complete search history.

(56) References Cited

U.S. PATENT DOCUMENTS

2020/0186085 A1*   6/2020   Niakate ................... H03B 5/04
2022/0407459 A1*   12/2022   Jung ........................ H03K 3/02

* cited by examiner

*Primary Examiner* — Jeffrey M Shin

(57) ABSTRACT

A frequency compensation circuit determines a target calibration count of a fixed capacitor coupled to a processing device. The frequency compensation circuit identifies a current calibration count of the fixed capacitor. The frequency compensation circuit determines that the current calibration count satisfies a threshold criterion associated with the target calibration count. In response to determining that the current calibration count satisfies the threshold criterion, the frequency compensation circuit adjusts a frequency of an internal oscillator of the processing device based on the current calibration count and the target calibration count.

20 Claims, 8 Drawing Sheets

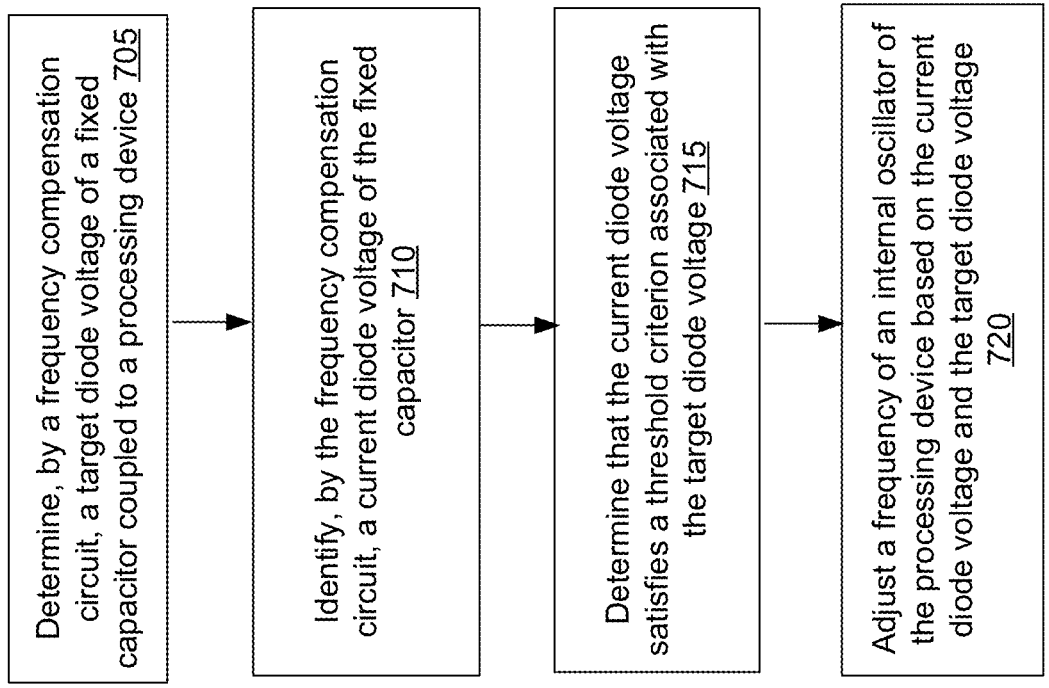

OSCILLATOR FREQUENCY COMPENSATION WITH A FIXED CAPACITOR

RELATED APPLICATION

This application is related to co-pending U.S. patent application Ser. No. 17/396,191, filed on Aug. 6, 2021, now published as U.S. Publication No. 2022/0066592, which is hereby incorporated by reference.

TECHNICAL FIELD

This disclosure relates to the field of sensing systems and, in particular, to sensing systems having oscillators with a fixed capacitor.

BACKGROUND

Computing devices, such as notebook computers, personal data assistants (PDAs), mobile communication devices, portable entertainment devices (such as handheld video game devices, multimedia players, and the like), and set-top-boxes (such as digital cable boxes, digital video disc (DVD) players, and the like) may have user interface devices, which are also known as human interface devices (HID), that facilitate interaction between the user and the computing device. One type of user interface device that has become more common is a sensing system that operates by way of touch sensing, such as capacitance sensing. A sensing system, such as a capacitance sensing system, may include a processing device and one or more capacitive sense electrodes. The capacitance detected of the capacitive sense electrodes by a processing device may change as a function of the proximity of a touch object to the capacitive sense array. The processing device may include an internal oscillator frequency that varies based on temperature and/or voltage.

BRIEF DESCRIPTION OF THE DRAWINGS

The present disclosure is illustrated by way of example, and not by way of limitation, in the figures of the accompanying drawings.

FIG. 7 is a flow diagram illustrating a method for adjusting the frequency of an oscillator with a fixed capacitor, according to embodiments of the present disclosure.

DETAILED DESCRIPTION

Figure 1:
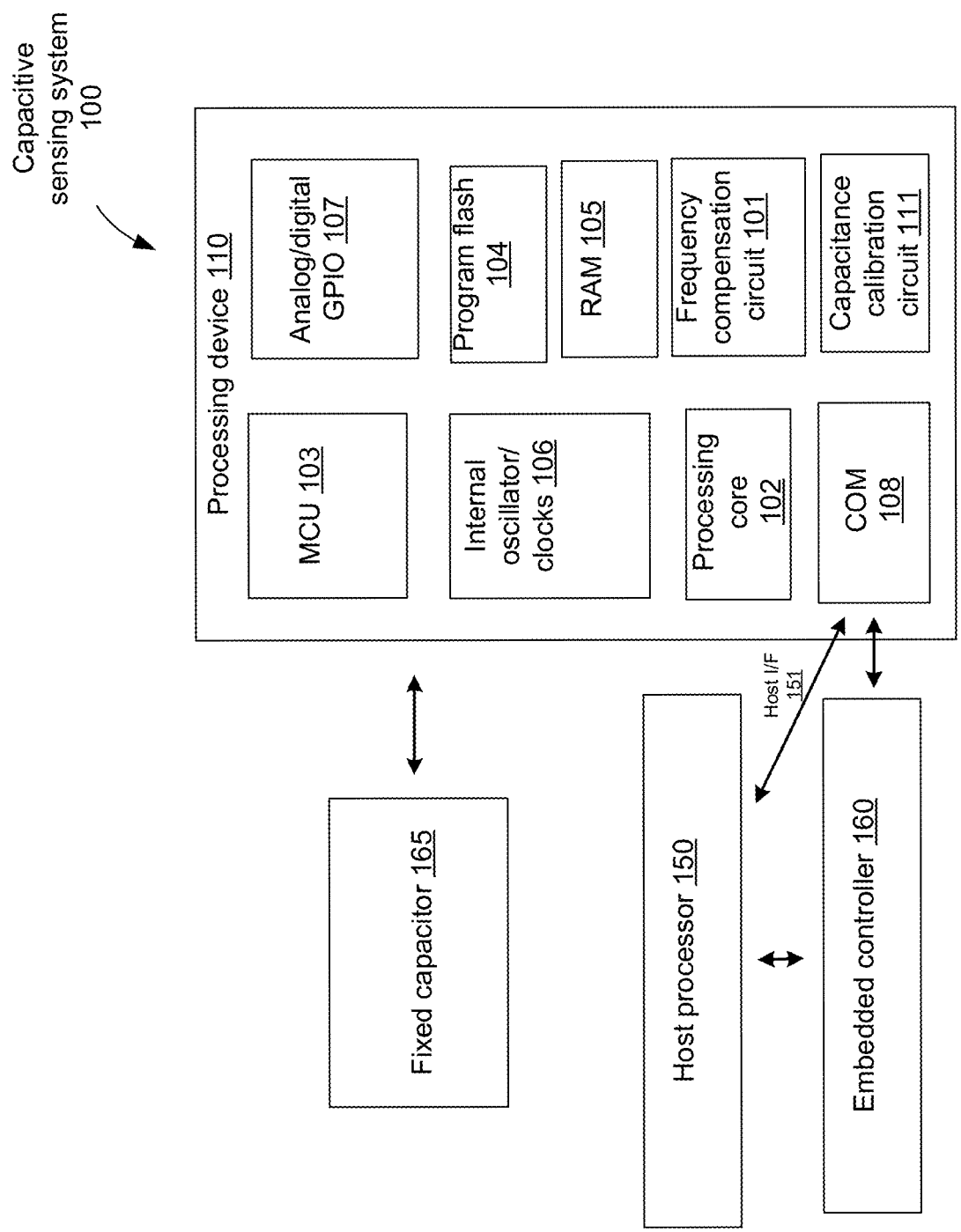
FIG. 1 is a block diagram illustrating a capacitive sensing system having a processing device for adjusting a frequency of an internal oscillator, according to embodiments of the present disclosure.

A sensing system, such as a capacitance sensing system, may include a processing device and one or more capacitive sense electrodes. The capacitance detected of the capacitive sense electrodes by a processing device may change as a function of the proximity of a touch object to the capacitive sense array. The processing device, such as a microcontroller and/or a programmable system on a chip (PSoC) integrated circuit (IC) device, may include an internal oscillator that resides on the chip.

The internal oscillator is typically used as a default clock source for the device. In certain devices, internal oscillators are often kept at a constant frequency (e.g., 24 MHz) in order to maintain accuracy in, e.g., wireless communication. However, in certain devices, the frequency of the internal oscillator typically varies based on temperature and/or voltage of the device. For example, certain devices have internal oscillators that vary as much as 2.5%. In order to keep the frequency constant over temperature and/or voltage, certain devices implement bandgap type circuits to compensate for temperature and/or voltage errors. However, bandgap-type circuits do not adequately compensate the oscillator frequency for temperature and/or voltage changes. Typically, bandgap-type circuits still have deviations in oscillator frequency of more than 1%. In other devices, another solution to improve the accuracy of the frequency is to utilize an external crystal oscillator. However, using an external crystal oscillator typically requires more analog architecture complexity, thus affecting the efficiency of the device.

The present disclosure addresses the above-mentioned deficiencies and others by adjusting the frequency of the internal oscillator of a device based on a current calibration count and a target calibration count of a fixed capacitor coupled to the device. In some embodiments, a frequency compensation circuit determines a target calibration count of the fixed capacitor. In some embodiments, the fixed capacitor can be internal to the device. In some embodiments, the fixed capacitor can be external to the device.

Determining the target calibration count can be based on identifying (e.g., measuring) and storing a set of values relating to the fixed capacitor at particular temperatures. For example, the frequency compensation circuit can identify a set of predetermined diode voltages for the fixed capacitor at particular temperatures (e.g., the diode voltage value at room temperature, at a cold temperature, and/or at a hot temperature). In some embodiments, the frequency compensation circuit converts each predetermined diode voltage into an ADC (analog to digital conversion) predetermined diode voltage. The frequency compensation circuit can store each predetermined diode voltage value in one or more registers of the device. In some embodiments, the frequency compensation circuit can further identify a set of values pertaining to a calibration count for the fixed capacitor at particular temperatures (e.g., at room temperature, at a cold temperature, and/or at a hot temperature). In some embodiments, the calibration count for the fixed capacitor can be measured as a count of a number of clock cycles the device takes for a current diode voltage of the fixed capacitor to reach a predetermined diode voltage of the fixed capacitor identified at a particular temperature (e.g., the predetermined diode voltage at room temperature, a cold temperature, and/or a hot temperature).

Determining the target calibration count can further include determining that the current diode voltage is greater than a predetermined diode voltage of the fixed capacitor identified at one of the particular temperatures (e.g., at room temperature). If the current diode voltage is less than the predetermined diode voltage at the particular temperature (e.g., the current diode voltage is less than the predetermined diode voltage at room temperature), the frequency compensation circuit can perform a linear interpolation of a set of values that are associated with the fixed capacitor at room temperature and at a hot temperature. For example, the frequency compensation circuit can perform a linear interpolation of the current diode voltage, the predetermined diode voltage at room temperature, the predetermined diode voltage at a hot temperature, the calibration count at room temperature, and/or the calibration count at a hot temperature. In some embodiments, if the current diode voltage is greater than the predetermined diode voltage at a particular temperature (e.g., the current diode greater is greater than the predetermined diode voltage at room temperature), the frequency compensation circuit can perform a linear interpolation of another set of values that are associated with the fixed capacitor at room temperature and at cold temperature. For example, the frequency compensation circuit can perform a linear interpolation of the current diode voltage, the predetermined diode voltage at room temperature, the predetermined diode voltage at cold temperature, the calibration count at room temperature, and/or the calibration count at cold temperature. Performing the linear interpolation of either set of values can result in a value that is the target calibration count. In some embodiments, the frequency compensation circuit can store the target calibration count in one or more registers of the device.

In some embodiments, the frequency compensation circuit further identified a current calibration count of the fixed capacitor. Identifying the current calibration count of the fixed capacitor can include measuring a count of a number of clock cycles the device takes for a current diode voltage of the fixed capacitor to reach a predetermined diode voltage of the fixed capacitor at a particular temperature.

In some embodiments, the frequency compensation circuit can determine that the current calibration count satisfies a threshold criterion associated with the target calibration count. In some embodiments, determining that the current calibration count satisfies the threshold criterion associated with the target calibration count can include determining that the current calibration count is within a threshold range of the target calibration count. For example, the threshold range can be a predetermined integer value, e.g., 2 counts (i.e., clock cycles).

In some embodiments, the frequency compensation circuit can, responsive to determining that the current calibration count satisfies the threshold criterion, adjust a frequency of an internal oscillator of the device. Adjusting the frequency of the internal oscillator can be based on the current calibration count and the target calibration count. For example, the frequency compensation circuit can compute a trim (e.g., adjustment) value by comparing the current calibration count and the target calibration count. The trim value can be a value to adjust the current calibration count to reach the target calibration count. The frequency compensation circuit can then adjust the frequency of the internal oscillator using the computed trim value.

Thus, by adjusting the frequency of the internal oscillator of a device based on a current calibration count and a target calibration count of a fixed capacitor of the device, the accuracy of the frequency of the internal oscillator can be improved with significantly less deviations (e.g., 0.5% deviations) than using bandgap type circuits to improve the accuracy of the frequency. Further, embodiments of the present invention adjusts the frequency of the internal oscillator without any modification to the hardware architecture of the device, thus saving cost and time by being able to implement and use the present disclosure on existing devices.

FIG. 1 illustrates a block diagram illustrating a capacitive sensing system having a processing device for adjusting a frequency of an internal oscillator, in accordance with some embodiments of the present disclosure. Capacitive sensing system 100 includes processing device 110, host processor 150, embedded controller 160, and a fixed capacitor 165. The processing device 110 may include analog and/or digital general purpose input/out ("GPIO") ports 107. GPIO ports 107 may be programmable. GPIO ports 107 may be coupled to a Programmable Interconnect and Logic ("PIL"; not illustrated), which acts as an interconnect between GPIO ports 107 and a digital block array of the processing device 110 (not illustrated). The digital block array may be configured to implement a variety of digital logic circuits (e.g., DACs, digital filters, or digital control systems) using, in some embodiments, configurable user modules ("UMs"). The digital block array may be coupled to a system bus. Processing device 110 may also include memory, such as random access memory (RAM) 105 and program flash 104. RAM 105 may be static RAM (SRAM), and program flash 104 may be a non-volatile storage, which may be used to store firmware (e.g., control algorithms described herein). Processing device 110 may also include a microcontroller unit (MCU) 103 coupled to memory and the processing core 102.

The processing device 110 may also include an analog block array (not illustrated). The analog block array is also coupled to the system bus. Analog block array may also be configured to implement a variety of analog circuits (e.g., ADCs or analog filters) using, in some embodiments, configurable UMs. The analog block array may also be coupled to the GPIO 107.

As illustrated, frequency compensation circuit 101 may be integrated into processing device 110. The frequency compensation circuit 101 may be operatively coupled to a capacitance calibration circuit 111. Frequency compensation circuit 101, the capacitance calibration circuit 111, and processing core 102 are described in more detail below.

Processing device 110 may include internal oscillator/clocks 106 and communication block 108. The oscillator/clocks 106 provides clock signals to one or more of the components of the processing device 110. Communication block 108 may be used to communicate with an external component, such as a host processor 150, via host interface (I/F) line 151. Alternatively, processing device 110 may also be coupled to embedded controller 160 to communicate with the external components, such as host processor 150. In some embodiments, the processing device 110 is configured to communicate with the embedded controller 160 or the host processor 150 to send and/or receive data.

Processing device 110 may reside on a common carrier substrate such as, for example, an integrated circuit (IC) die substrate, a multi-chip module substrate, or the like. Alternatively, the components of processing device 110 may be one or more separate integrated circuits and/or discrete components. In some embodiments, processing device 110 may be a Programmable System on a Chip (PSoC™) processing device, manufactured by Cypress Semiconductor Corporation, San Jose, Calif. Alternatively, processing device 110 may be one or more processing devices known by those of ordinary skill in the art, such as a microprocessor or central processing unit, a controller, special-purpose processor, digital signal processor (DSP), an application-specific integrated circuit (ASIC), a field-programmable gate array (FPGA), or the like.

It should also be noted that the embodiments described herein are not limited to having a configuration of a processing device coupled to a host, but may include a system that measures each diode voltage and/or calibration count values and sends the raw data to a host computer where it is analyzed by an application. In effect, the processing that is done by processing device 110 may also be done in the host.

Frequency compensation circuit 101 and/or capacitance calibration circuit 111 may be integrated into the IC of the processing device 110, or alternatively, in a separate IC. Alternatively, description of frequency compensation circuit 101 and/or capacitance calibration circuit 111 may be generated and compiled for incorporation into other integrated circuits. For example, behavioral level code describing frequency compensation circuit 101, or portions thereof, may be generated using a hardware descriptive language, such as VHDL or Verilog, and stored in a machine-accessible medium (e.g., CD-ROM, hard disk, floppy disk, etc.). Furthermore, the behavioral level code can be compiled into register transfer level ("RTL") code, a netlist, or even a circuit layout and stored in a machine-accessible medium. The behavioral level code, the RTL code, the netlist, and the circuit layout all represent various levels of abstraction to describe frequency compensation circuit 101.

It should be noted that the components of capacitive sensing system 100 may include all the components described above. Alternatively, capacitive sensing system 100 may include only some of the components described above.

In some embodiments, the capacitive sensing system 100 may be used in applications, such as a mobile handset, a personal data assistant (PDA), a keyboard, a television, a remote control, a monitor, a handheld multimedia device, a handheld video player, a handheld gaming device, a control panel, etc.

Figure 2A:
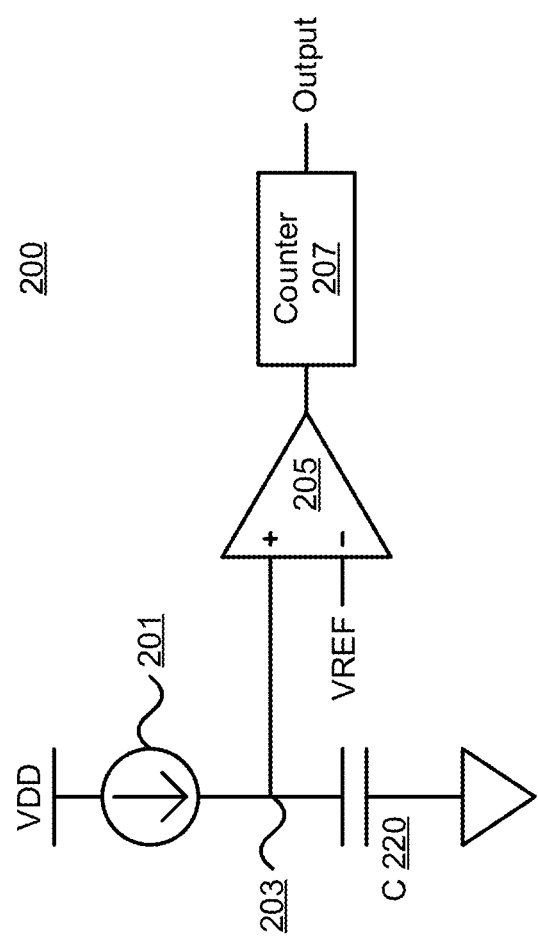
FIG. 2A illustrates one embodiment of a single-slope converter circuit, according to embodiments of the present disclosure.

FIG. 2A illustrates one embodiment of a single-slope converter circuit 200, according to embodiments of the present disclosure. The single-slope converter circuit 200 may include a current source 201 coupled to a reference capacitor 220. In some embodiments, the current source 201 can be a known current, such as a current digital-to-analog converter (IDAC), a switched capacitor circuit, a resistor, etc. The other node of reference capacitor 220 may be coupled to a ground potential or to some other voltage potential. The node 203 of the reference capacitor 220 that is coupled to current source 201 may be coupled to a first input of comparator 205. The second input of comparator 205 may be coupled to a reference voltage, VREF. The output of comparator 205 may be coupled to a counter 207, such that when the voltage across reference capacitor 220 reaches VREF, the counter 207 is stopped, and the value is output for comparison to the target calibration count, as described in more details with reference to FIGS. 3-6.

Figure 2B:
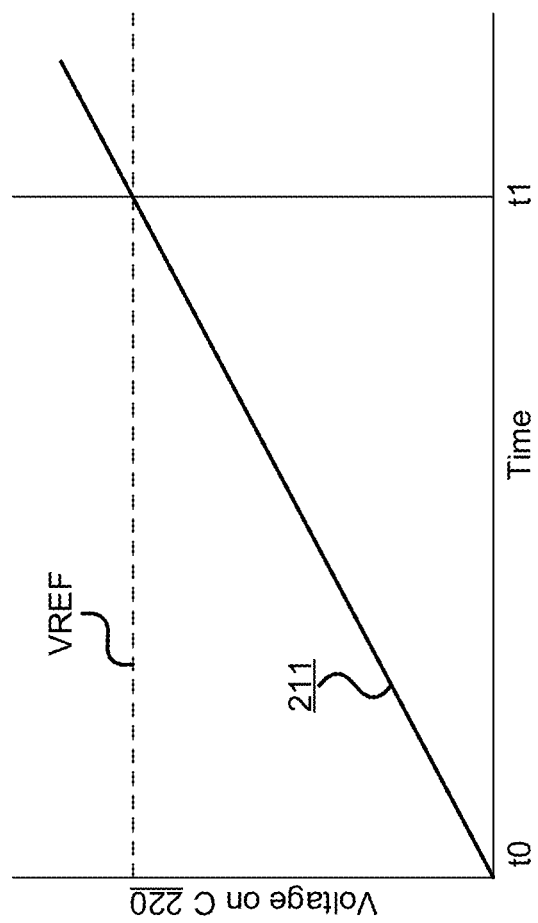
FIG. 2B illustrates the operation of the single-slop converter circuit of FIG. 2A, according to embodiments of the present disclosure.

FIG. 2B illustrates the operation of the single-slope converter circuit 200 of FIG. 2A. The voltage across reference capacitor 220 is represented by slope 211. At time t0, the voltage on reference capacitor 220 is zero (or some other starting voltage). As current is applied to reference capacitor 220 by current source 201, the voltage across the reference capacitor 220 increases. When the voltage across the reference capacitor 220 reaches VREF at time t1, the counter 207 is stopped, and the current calibration count is then compared to the target calibration count, as described in more details with reference to FIGS. 3-6.

Figure 3:
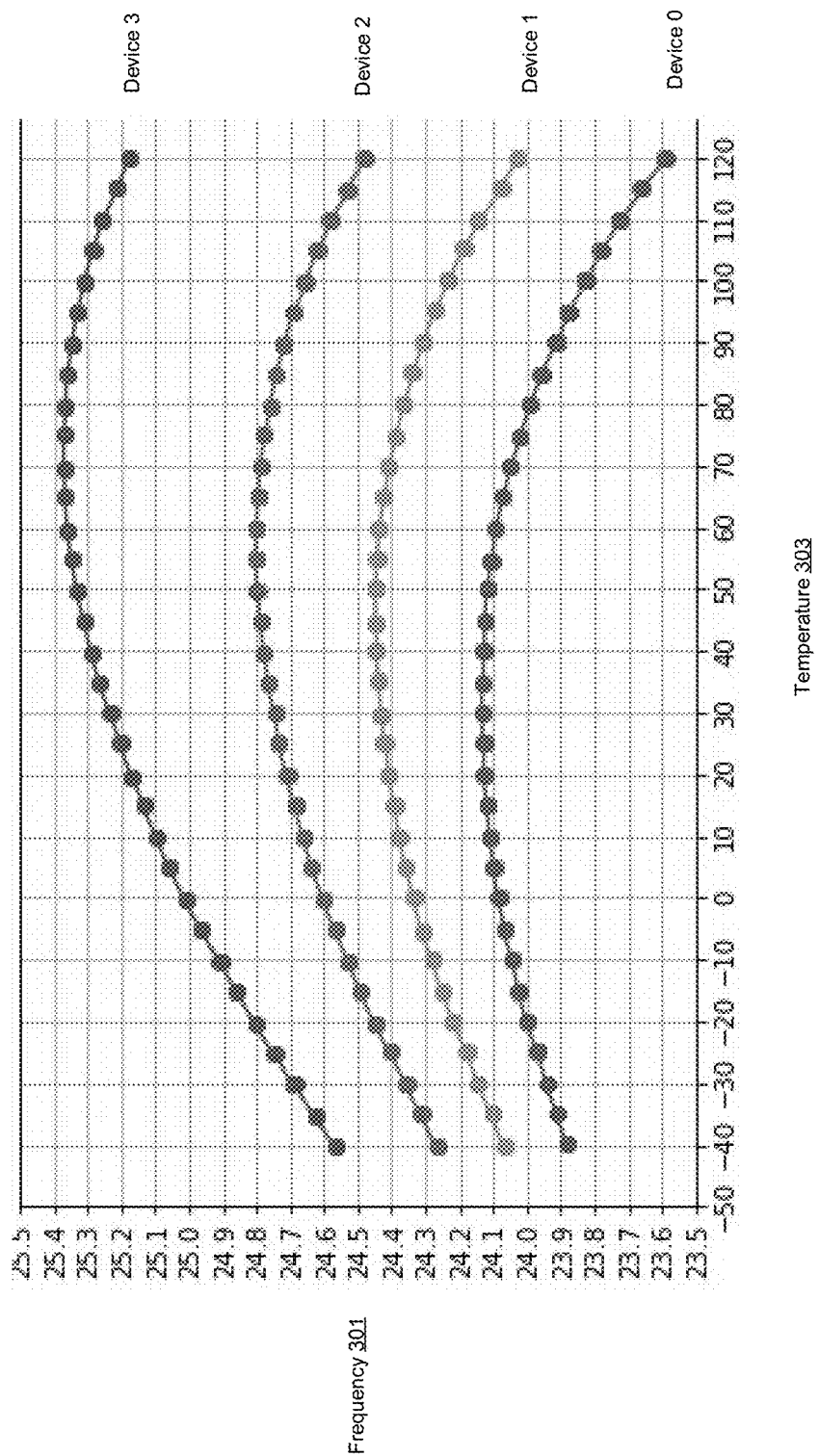
FIG. 3 illustrates variations in oscillator frequency based on temperature, according to embodiments of the present disclosure.

FIG. 3 illustrates variations in oscillator frequency based on temperature, according to embodiments of the present disclosure. As described herein, the frequency of an internal oscillator (e.g., the internal oscillator 106 of FIG. 1) typically varies based on the temperature of a device (e.g., the processing device 110 of FIG. 1). As illustrated in FIG. 3, certain devices have internal oscillators that vary widely in accuracy. For example, device 0 in FIG. 3 has an oscillator frequency deviation of 2.26%. Device 1 has an oscillator frequency deviation of 1.75%. Device 2 has an oscillator frequency deviation of 2.24%. Device 3 has an oscillator frequency deviation of 3.35%.

Figure 6:
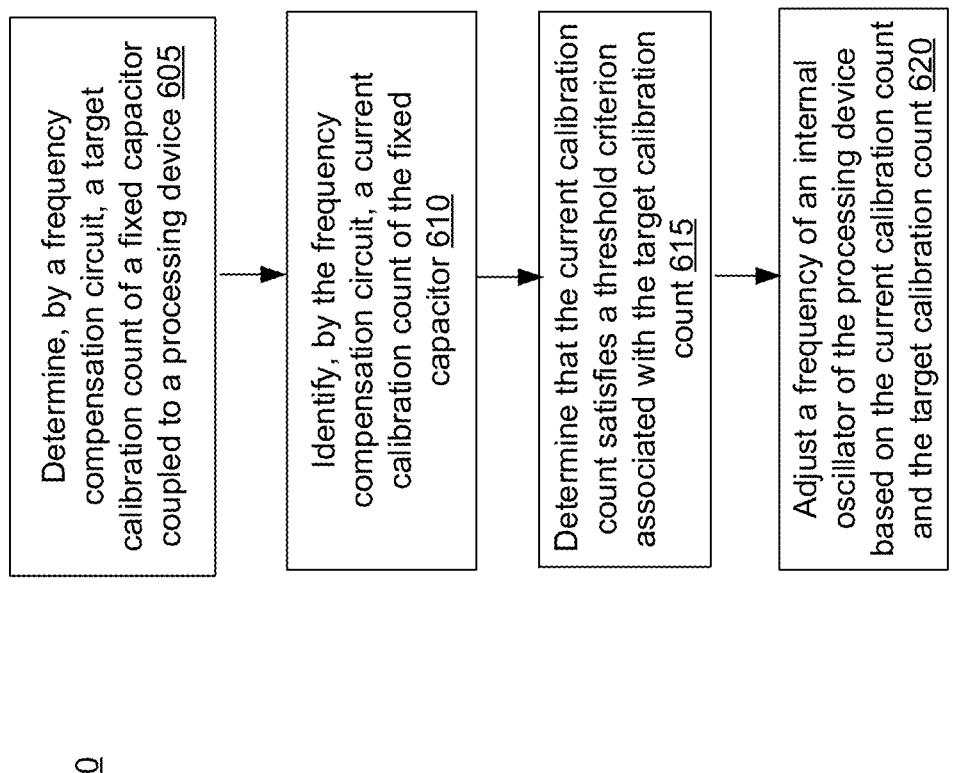
FIG. 6 is a flow diagram illustrating a method for adjusting the frequency of an oscillator with a fixed capacitor, according to embodiments of the present disclosure.

FIG. 6 is a flow diagram illustrating a method 600 for adjusting the frequency of an oscillator with a fixed capacitor, according to embodiments of the present disclosure. Method 600 may be performed by processing logic that comprises hardware (e.g., circuitry, dedicated logic, programmable logic, microcode), software (e.g., instructions run on a processing device to perform hardware simulation), or a combination thereof. In some embodiments, frequency compensation circuit 101 of FIG. 1 may perform some, or all of the operations described herein.

Method 600 begins at block 605, where the processing logic operates a frequency compensation circuit to determine a target calibration count of a fixed capacitor (e.g., the fixed capacitor 165 of FIG. 1) coupled to a processing device (e.g., the processing device 110 of FIG. 1). In some embodiments, the frequency compensation circuit includes and/or is operatively coupled to a capacitance calibration circuit (e.g., the capacitance calibration circuit 111 of FIG. 1) to determine the target calibration count of the fixed capacitor. In some embodiments, the fixed capacitor can be internal to the processing device. In some embodiments, the fixed capacitor can be external to the processing device. Determining the target calibration count can be based on identifying (e.g., measuring) and storing a set of values relating to the fixed capacitor at particular temperatures. For example, the frequency compensation circuit can identify a set of values pertaining to the diode voltage for the fixed capacitor at particular temperatures (e.g., the diode voltage value at room temperature, at a cold temperature, and/or at a hot temperature). In some embodiments, the frequency compensation circuit converts the identified diode voltage into an ADC (analog to digital conversion) diode voltage. The frequency compensation circuit can store each diode voltage value in one or more registers of the device or in another memory component of the device (e.g., program flash 104 and/or RAM 105 of FIG. 1). In some embodiments, the frequency compensation circuit can identify a set of values pertaining to a calibration count for the fixed capacitor at particular temperatures (e.g., at room temperature, at a cold temperature, and/or at a hot temperature). In some embodiments, the calibration count for the fixed capacitor can be measured as a count of a number of clock cycles the device takes for a current diode voltage of the fixed capacitor to reach a predetermined diode voltage of the fixed capacitor at a particular temperature (e.g., the identified diode voltage at room temperature, a cold temperature, and/or a hot temperature).

Figure 4:
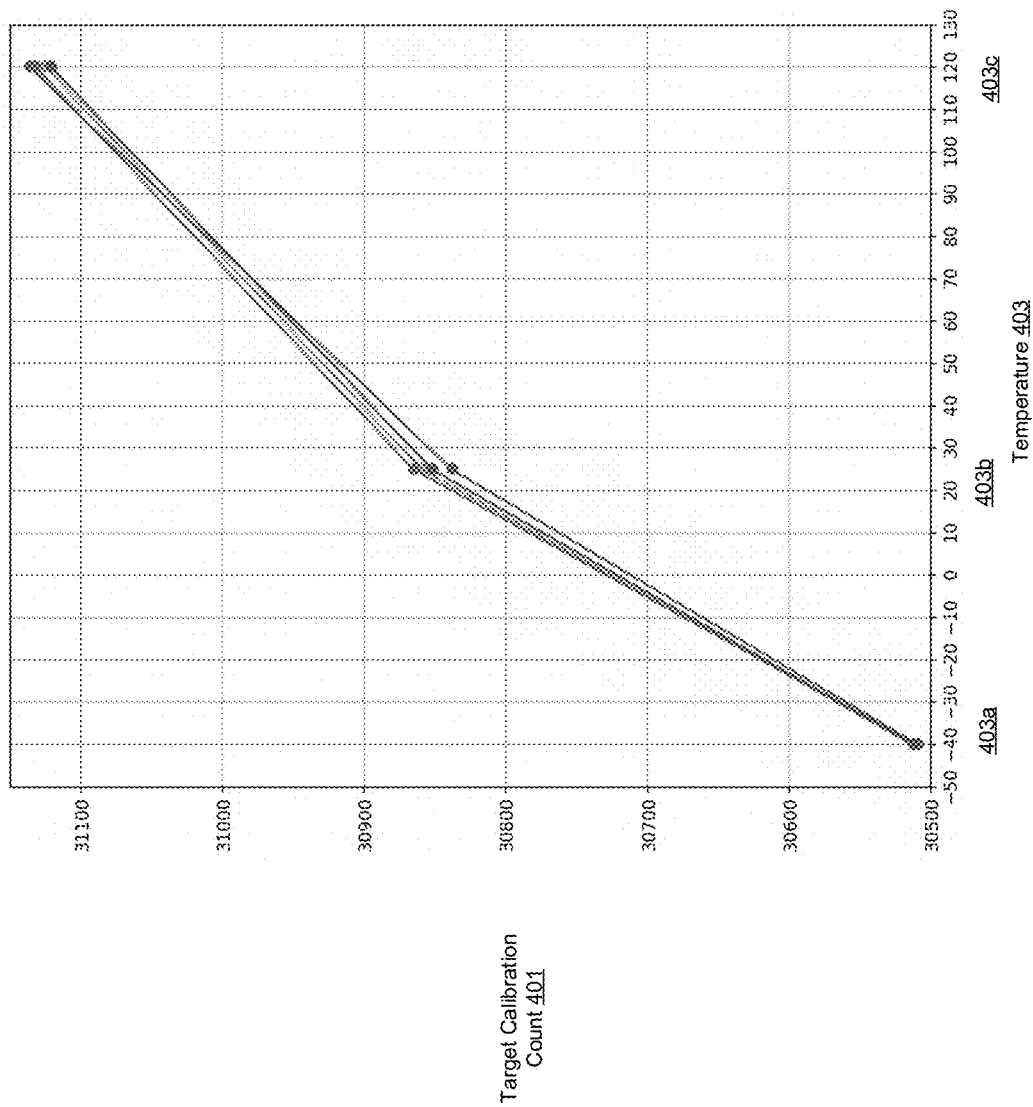
FIG. 4 illustrates a target calibration count for a device at particular temperatures, according to embodiments of the present disclosure.

In some embodiments, determining the target calibration count can include determining that the current diode voltage is greater than a predetermined diode voltage of the fixed capacitor identified at one of the particular temperatures (e.g., at room temperature). If the current diode voltage is less than the predetermined diode voltage at the particular temperature (e.g., the current diode voltage is less than the predetermined diode voltage at room temperature), the frequency compensation circuit can perform an interpolation (e.g., a linear interpolation) of a set of values that are associated with the fixed capacitor at room temperature and at a hot temperature. In some embodiments, the frequency compensation circuit can perform a linear interpolation of the current diode voltage, the predetermined diode voltage at room temperature, the predetermined diode voltage at a hot temperature, the calibration count at room temperature, and/or the calibration count at a hot temperature. In some embodiments, if the current diode voltage is greater than the predetermined diode voltage at a particular temperature (e.g., the current diode greater is greater than the predetermined diode voltage at room temperature), the frequency compensation circuit can perform an interpolation (e.g., a linear interpolation) of another set of values that are associated with the fixed capacitor at room temperature and at cold temperature. For example, the frequency compensation circuit can perform a linear interpolation of the current diode voltage, the predetermined diode voltage at room temperature, the predetermined diode voltage at cold temperature, the calibration count at room temperature, and/or the calibration count at cold temperature. Performing the linear interpolation of either set of values can result in the target calibration count. In some embodiments, the frequency compensation circuit can store the target calibration count in one or more registers of the device. As illustrated in FIG. 4, the target calibration count 401 at particular temperatures (temperature 403a, temperature 403b, and temperature 403c) can be determined.

At block 610, the processing logic identifies a current calibration count of the fixed capacitor. In some embodiments, the frequency compensation circuit identifies the current calibration count. In some embodiments, the capacitance calibration circuit identifies the current calibration count of the fixed capacitor. In some embodiments, identifying the current calibration count of the fixed capacitor can include measuring a count of a number of clock cycles the device takes for a current diode voltage of the fixed capacitor to reach a predetermined diode voltage of the fixed capacitor at a particular temperature. Measuring the count of the number of clock cycles can be performed using a preconfigured calibration circuit associated with the processing device.

At block 615, the processing logic determines that the current calibration count satisfies a threshold criterion associated with the target calibration count. In some embodiments, determining that the current calibration count satisfies the threshold criterion associated with the target calibration count can include determining that the current calibration count is within a threshold range of the target calibration count. For example, the threshold range can be a predetermined integer value, e.g., 2 counts (i.e., clock cycles).

At block 620, the processing logic adjusts a frequency of an internal oscillator (e.g., the internal oscillator 106 of FIG. 1) of the processing device. In some embodiments, the processing logic adjusts the frequency of the internal oscillator based on the current calibration count and the target calibration count. Adjusting the frequency of the internal oscillator can be responsive to determining that the current calibration count satisfies the threshold criterion. In some embodiments, adjusting the frequency of the internal oscillator can be based on the current calibration count and the target calibration count. For example, the frequency compensation circuit can compute a trim (e.g., adjustment) value by comparing the current calibration count and the target calibration count. The trim value can be a value to adjust the current calibration count to reach the target calibration count. The frequency compensation circuit can then adjust the frequency of the internal oscillator using the computed trim value.

FIG. 7 is a flow diagram illustrating a method 700 for adjusting the frequency of an oscillator with a fixed capacitor, according to embodiments of the present disclosure. Method 700 may be performed by processing logic that comprises hardware (e.g., circuitry, dedicated logic, programmable logic, microcode), software (e.g., instructions run on a processing device to perform hardware simulation), or a combination thereof. In some embodiments, frequency compensation circuit 101 of FIG. 1 may perform some, or all of the operations described herein.

Method 700 begins at block 705, where the processing logic operates a frequency compensation circuit to determine a target diode voltage of a fixed capacitor coupled to the processing device. In some embodiments, the fixed capacitor can be internal to the processing device. In some embodiments, the fixed capacitor can be external to the processing device. Determining the target diode voltage can include identifying (e.g., measuring) and storing a set of values relating to the fixed capacitor at particular temperatures. For example, the frequency compensation circuit can identify a set of values pertaining to the diode voltage for the fixed capacitor at particular temperatures (e.g., the diode voltage value at room temperature, at a cold temperature, and/or at a hot temperature). In some embodiments, the frequency compensation circuit converts the identified diode voltage into an ADC (analog to digital conversion) diode voltage. The frequency compensation circuit can store each diode voltage value in one or more registers of the device.

Figure 5:
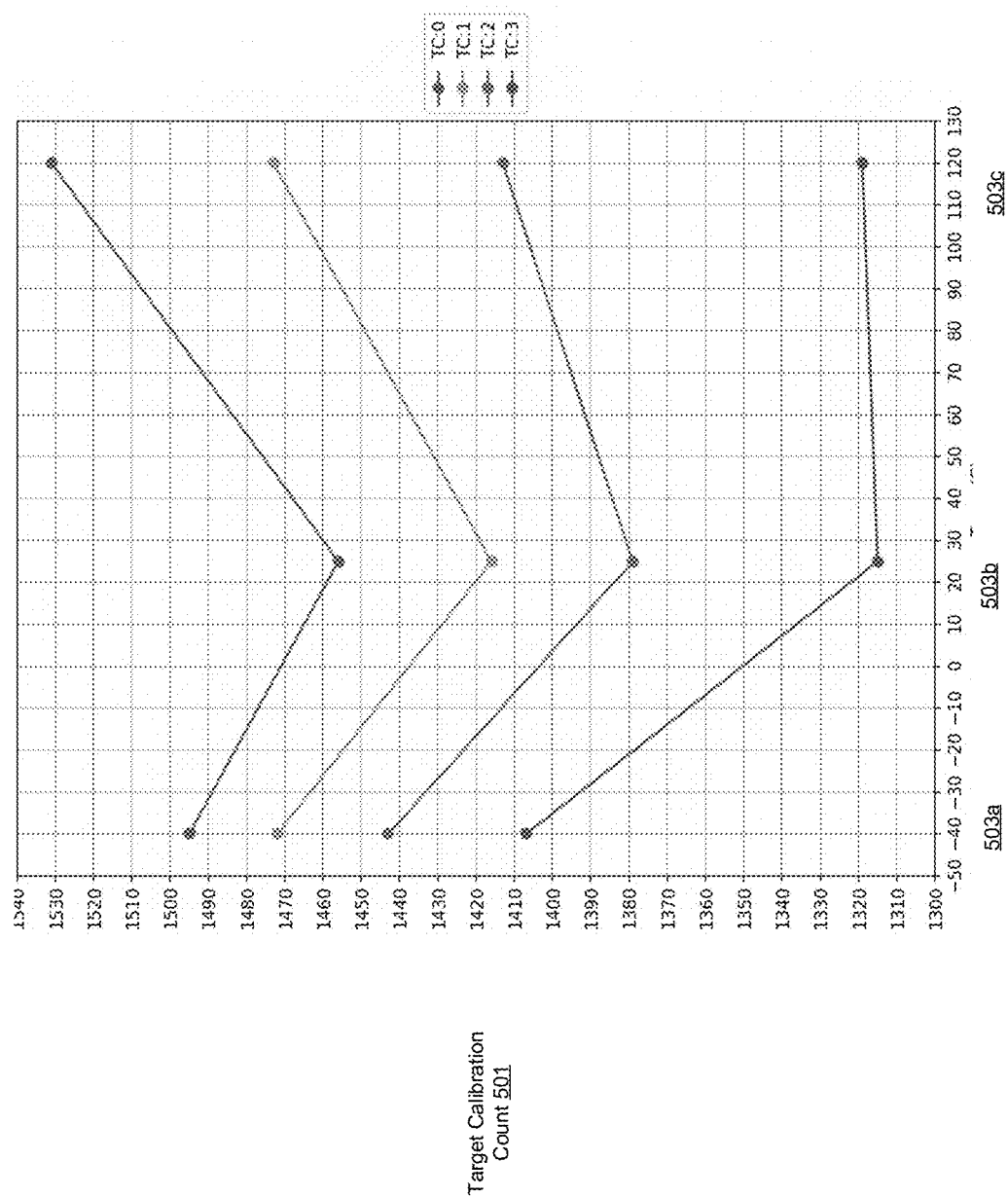
FIG. 5 illustrates a target diode voltage for a device at particular temperatures, according to embodiments of the present disclosure.

In some embodiments, determining the target diode voltage can include determining that the current diode voltage is greater than a predetermined diode voltage of the fixed capacitor identified at one of the particular temperatures (e.g., at room temperature). If the current diode voltage is less than the predetermined diode voltage at the particular temperature (e.g., the current diode voltage is less than the predetermined diode voltage at room temperature), the frequency compensation circuit can perform an interpolation (e.g., a linear interpolation) of a set of values that are associated with the fixed capacitor at room temperature and at a hot temperature. In some embodiments, the frequency compensation circuit can perform a linear interpolation of the current diode voltage, the predetermined diode voltage at room temperature, and/or the predetermined diode voltage at a hot temperature. In some embodiments, if the current diode voltage is greater than the predetermined diode voltage at a particular temperature (e.g., the current diode greater is greater than the predetermined diode voltage at room temperature), the frequency compensation circuit can perform an interpolation (e.g., a linear interpolation) of another set of values that are associated with the fixed capacitor at room temperature and at cold temperature. For example, the frequency compensation circuit can perform a linear interpolation of the current diode voltage, the predetermined diode voltage at room temperature, and/or the predetermined diode voltage at cold temperature. Performing the linear interpolation of either set of values can result in the target diode voltage. In some embodiments, the frequency compensation circuit can store the target diode voltage in one or more registers of the device. As illustrated in FIG. 5, the target diode voltage 501 at particular temperatures (temperature 503a, temperature 503b, and temperature 503c) can be determined.

At block 710, the processing logic identifies, by the frequency compensation circuit, a current diode voltage of the fixed capacitor.

At block 715, the processing logic determines that the current diode voltage satisfies a threshold criterion associated with the target diode voltage. In some embodiments, determining that the target diode voltage satisfies the threshold criterion associated with the target diode voltage can include determining that the current calibration count is within a threshold range of the target diode voltage. The threshold range can be a predetermined integer value.

At block 720, the processing logic adjusts a frequency of an internal oscillator (e.g., the internal oscillator 106 of FIG. 1) of the processing device. In some embodiments, the processing logic adjusts the frequency of the internal oscillator based on the current diode voltage and the target diode voltage. Adjusting the frequency of the internal oscillator can be responsive to determining that the current diode voltage satisfies the threshold criterion. In some embodiments, adjusting the frequency of the internal oscillator can be based on the current diode voltage and the target diode voltage. For example, the frequency compensation circuit can compute a trim (e.g., adjustment) value by comparing the current diode voltage and the target diode voltage. The trim value can be a value to adjust the current diode voltage to reach the target diode voltage. The frequency compensation circuit can then adjust the frequency of the internal oscillator using the computed trim value.

Certain embodiments of the present disclosure may be implemented as a computer program product that may include instructions stored on a machine-readable medium. These instructions may be used to program a general-purpose or special-purpose processor to perform the described operations. A machine-readable medium includes any mechanism for storing or transmitting information in a form (e.g., software, processing application) readable by a machine (e.g., a computer). The machine-readable medium may include, but is not limited to, a magnetic storage medium (e.g., floppy diskette); an optical storage medium (e.g., CD-ROM); a magneto-optical storage medium; a read-only memory (ROM); a random-access memory (RAM); an erasable programmable memory (e.g., EPROM and EEPROM); a flash memory; or another type of medium suitable for storing electronic instructions.

Additionally, some embodiments may be practiced in distributed computing environments where the machine-readable medium is stored on and/or executed by more than one computer system. In addition, the information transferred between computer systems may either be pulled or pushed across the communication medium connecting the computer systems.

Although the operations of the methods herein are shown and described in a particular order, the order of the operations of each method may be altered so that certain operations may be performed in an inverse order or so that certain operations may be performed, at least in part, concurrently with other operations. In another embodiment, instructions or sub-operations of distinct operations may be in an intermittent and or alternating manner. The terms "first," "second," "third," "fourth," etc., as used herein, are meant as labels to distinguish among different elements and may not necessarily have an ordinal meaning according to their numerical designation. As used herein, the term "coupled" may mean connected directly or indirectly through one or more intervening components. Any of the signals provided over various buses described herein may be time-multiplexed with other signals and provided over one or more common on-die buses. Additionally, the interconnection and interfaces between circuit components or blocks may be shown as buses or single signal lines. Each of the buses may alternatively be one or more single signal lines, and each of the single signal lines may alternatively be buses.

The above description sets forth numerous specific details, such as examples of specific systems, components, methods, and so forth, in order to provide an understanding of several embodiments of the present invention. It may be apparent to one skilled in the art, however, that at least some embodiments of the present invention may be practiced without these specific details. In other instances, well-known components or methods are not described in detail or are presented in simple block diagram format in order to avoid unnecessarily obscuring the present invention. Thus, the specific details set forth are merely exemplary. Particular implementations may vary from these exemplary details and still be contemplated to be within the scope of the present invention.

What is claimed is:

1. A method, comprising:
   determining, by a frequency compensation circuit, a target calibration count of a fixed capacitor coupled to a processing device;
   identifying, by the frequency compensation circuit, a current calibration count of the fixed capacitor;
   determining that the current calibration count satisfies a threshold criterion associated with the target calibration count; and
   responsive to determining that the current calibration count satisfies the threshold criterion, adjusting a frequency of an internal oscillator of the processing device based on the current calibration count and the target calibration count.

2. The method of claim 1, wherein determining the target calibration count of the fixed capacitor comprises:
   identifying a current diode voltage associated with the fixed capacitor;
   determining that the current diode voltage is greater than a predetermined diode voltage associated with the fixed capacitor; and
   responsive to determining that the current diode voltage is greater than the predetermined diode voltage, performing an interpolation of a first set of values associated with the fixed capacitor to determine the target calibration count, wherein the first set of values comprises at least the current diode voltage and the predetermined diode voltage.

3. The method of claim 2, further comprising:
   responsive to determining that the current diode voltage is less than the predetermined diode voltage, performing an interpolation of a second set of values associated with the fixed capacitor to determine the target calibration count, wherein the second set of values comprises at least the current diode voltage and the predetermined diode voltage.

4. The method of claim 1, wherein determining that the current calibration count satisfies the threshold criterion associated with the target calibration count comprises:
   determining that the current calibration count is within a threshold range of the target calibration count.

5. The method of claim 1, wherein adjusting the frequency of the internal oscillator of the processing device based on the current calibration count and the target calibration count comprises:

computing a trim value based on comparing the current calibration count to the target calibration count; and adjusting the frequency of the internal oscillator using the trim value.

6. The method of claim 1, wherein the fixed capacitor is internal to the processing device.

7. The method of claim 1, wherein the fixed capacitor is external to the processing device.

8. An apparatus, comprising:
a frequency compensation circuit, operatively coupled to a processing device
a fixed capacitor, wherein the fixed capacitor is operatively coupled to the processing device; and
an internal oscillator to generate a clock signal, wherein the frequency compensation circuit is to adjust a frequency of the internal oscillator based on a current calibration count and a target calibration count of the fixed capacitor.

9. The apparatus of claim 8, wherein the frequency compensation circuit is further to determine the target calibration count of the fixed capacitor, identify the current calibration count of the fixed capacitor, and determine that the current calibration count satisfies a threshold criterion associated with the target calibration count.

10. The apparatus of claim 9, wherein the frequency compensation circuit is further to:
identify a current diode voltage associated with the fixed capacitor;
determine that the current diode voltage is greater than a predetermined diode voltage associated with the fixed capacitor; and
responsive to determining that the current diode voltage is greater than the predetermined diode voltage, perform an interpolation of a first set of values associated with the fixed capacitor to determine the target calibration count, wherein the first set of values comprises at least the current diode voltage and the predetermined diode voltage.

11. The apparatus of claim 8, wherein the frequency compensation circuit further comprises:
a capacitance calibration circuit to determine a current calibration count and a target calibration count of the fixed capacitor.

12. The apparatus of claim 9, wherein, to adjust the frequency of the internal oscillator, the frequency compensation circuit is further to:
compute a trim value based on comparing a current calibration count of the fixed capacitor to a target calibration count of the fixed capacitor; and
adjust the frequency of the internal oscillator using the trim value.

13. The apparatus of claim 8, wherein the fixed capacitor is internal to the processing device.

14. The apparatus of claim 8, wherein the fixed capacitor is external to the processing device.

15. A system, comprising:
a processing device;
a fixed capacitor, wherein the fixed capacitor is operatively coupled to the processing device;
an internal oscillator of the processing device to generate a clock signal; and
a frequency compensation circuit, operatively coupled to the processing device, to:
determine a target calibration count of the fixed capacitor;
identify a current calibration count of the fixed capacitor;
determine that the current calibration count satisfies a threshold criterion associated with the target calibration count; and
responsive to determining that the current calibration count satisfies the threshold criterion, adjust a frequency of the internal oscillator based on the current calibration count and the target calibration count.

16. The system of claim 15, wherein, to determine the target calibration count of the fixed capacitor, the frequency compensation circuit is further to:
identify a current diode voltage associated with the fixed capacitor;
determine that the current diode voltage is greater than a predetermined diode voltage associated with the fixed capacitor; and
responsive to determining that the current diode voltage is greater than the predetermined diode voltage, perform an interpolation of a first set of values associated with the fixed capacitor to determine the target calibration count, wherein the first set of values comprises at least the current diode voltage and the predetermined diode voltage.

17. The system of claim 16, wherein the frequency compensation circuit is further to:
responsive to determining that the current diode voltage is less than the predetermined diode voltage, perform an interpolation of a second set of values associated with the fixed capacitor to determine the target calibration count, wherein the second set of values comprises at least the current diode voltage and the predetermined diode voltage.

18. The system of claim 15, wherein to determine that the current calibration count satisfies the threshold criterion associated with the target calibration count, the frequency compensation circuit is further to:
determine that the current calibration count is within a threshold range of the target calibration count.

19. The system of claim 15, wherein to adjust the frequency of the internal oscillator, the frequency compensation circuit is further to:
compute a trim value based on comparing the current calibration count to the target calibration count; and
adjust the frequency of the internal oscillator using the trim value.

20. The system of claim 15, wherein the fixed capacitor is internal to the processing device.

* * * * *